United States Patent [19]

Seiwa

[11] Patent Number: 5,010,375
[45] Date of Patent: Apr. 23, 1991

[54] SEMICONDUCTOR LASER DEVICE

[75] Inventor: Yoshito Seiwa, Itami, Japan

[73] Assignee: Mitsubishi Denki Kabushiki Kaisha, Japan

[21] Appl. No.: 353,029

[22] Filed: May 17, 1989

[30] Foreign Application Priority Data

May 23, 1988 [JP] Japan .................. 63-126111

[51] Int. Cl.$^5$ .................................. H01L 29/161
[52] U.S. Cl. .................................. 357/16; 357/17; 372/43; 372/45
[58] Field of Search .................. 357/16, 17, 4; 372/43, 372/45, 44, 46

[56] References Cited

U.S. PATENT DOCUMENTS

| | | | |
|---|---|---|---|
| 4,667,332 | 5/1987 | Mihashi et al. | 372/45 |
| 4,829,023 | 5/1989 | Nagai et al. | 357/17 |
| 4,839,307 | 6/1989 | Imanaka et al. | 357/17 |
| 4,845,724 | 7/1989 | Hayakawa et al. | 372/45 |

FOREIGN PATENT DOCUMENTS

| | | | |
|---|---|---|---|
| 0188386 | 8/1987 | Japan | 357/17 |
| 0233588 | 9/1988 | Japan | 372/43 |

OTHER PUBLICATIONS

Sakai et al., "AlGaAs/GaAs DH Lasers . . . by MOCVD", Japanese Journal of Applied Physics, vol. 24, No. 8, Aug. 1985, pp. L666-L668.
Mihashi et al, "A Novel Self-Aligned . . . MO-CVD", Extended Abstracts of the 17th Conference on Solid State Devices and Materials, Tokyo, 1985, pp. 63-66.

Primary Examiner—Rolf Hille
Assistant Examiner—Minhloan Tran
Attorney, Agent, or Firm—Leydig, Voit & Mayer

[57] ABSTRACT

A semiconductor laser device include a Si substrate, a current confinement layer having an aperture disposed on the substrate, compound semiconductor layers disposed on the current confinement layer and on the Si substrate at the aperture of the current confinement layer, and a buffer layer for relieving the stress caused by the difference in lattice constants disposed between the Si substrate and the compound semiconductor layers. The Si substrate is of a first conductivity type and the current confinement layer is of a second conductivity type, or the current confinement layer comprises a compound semiconductor while the substrate comprises Si. The aperture of the current confinement layer is produced by anodic oxidation and selective etching of the current confinement layer. Therefore, a good regrowth interface at the substrate is obtained. There are no problems from residual oxides at the surface of the substrate, of Si or p type impurities diffusing out of the surface of the substrate, or of non-uniform thermal etching during the subsequent crystal growth processes.

5 Claims, 1 Drawing Sheet

SEMICONDUCTOR LASER DEVICE

FIELD OF THE INVENTION

The present invention relates to a semiconductor laser device and particularly a laser such as a Self-Aligned Bent Active (SBA) laser having a reduced operating voltage.

BACKGROUND OF THE INVENTION

FIG. 2 shows a cross-sectional view of a prior art SBA laser disclosed in "Extended Abstracts of 17th Conference on Solid State Devices and Materials, 1985, pp.63 to 66". In FIG. 2, reference numeral 11 designates a p type GaAs substrate. A p type $Al_{0.43}Ga_{0.57}As$ layer 12 is disposed on the substrate 11. An n type GaAs current confinement layer 13 is disposed on the layer 12. A p type $Al_{0.43}Ga_{0.57}As$ lower cladding layer 14 is disposed on the current confinement layer 13 and on the portion of the layer 12 not covered by current confinement layer 13. An undoped $Al_{0.07}Ga_{0.93}As$ active layer 15 is disposed on the lower cladding layer 14. An n type $Al_{0.43}Ga_{0.57}As$ upper cladding layer 16 is disposed on the active layer 15. An n type GaAs contact layer 17 is disposed on the upper cladding layer 16. Reference numeral 18 designates a channel region, reference numeral 19 designates an active region, and reference numeral 20 designates a re-growth interface.

The production process of this laser device will be described.

First of all, a p type $Al_{0.43}Ga_{0.57}As$ layer 12 is grown on the p type GaAs substrate 11 and an n type GaAs current confinement layer 13 is grown on the layer 12. A central portion of the current confinement layer 12 is removed by etching. The etching is stopped by the $Al_{0.43}Ga_{0.57}As$ layer 13 because it has an etching speed that is much lower than that of the GaAs current confinement layer 13. Thereafter, a p type $Al_{0.43}Ga_{0.57}As$ lower cladding layer 14, an undoped $Al_{0.07}Ga_{0.93}As$ active layer 15, an n type $Al_{0.43}Ga_{0.57}As$ upper cladding layer 16 and an n type GaAs contact layer 17 are successively grown. The lower cladding layer 14 is grown on the surface of the layer 12 that is not covered by the current blocking layer 13 and on the current confinement layer 13 by Metal Organic Chemical Vapor Deposition (MOCVD) method so that the stripe configuration is maintained. This MOCVD process is carried out at a temperature of 700° to 800° C. Thus, a planar region of the active layer 15, constituting the active region 19 is disposed opposite and spaced from the portion of the layer 12 that is not covered by current confinement layer 13. Although not shown in the figure, a p side and n side electrode are disposed on the substrate 11 and contacting layer 17 of the laser device, respectively.

The device will operate as follows.

In this laser device, when a voltage is applied between the p side and n side electrodes, a current is injected into the active region 19 through the channel region 18 at the aperture portion of the current confinement layer 13. Since the energy band gaps of the cladding layers 14 and 16 are larger than that of the active region 19, current is confined in the active region 19, and light having a wavelength corresponding to the energy band gap of the active region 19 is generated. On the other hand, since the refractive index of the active region 19 is larger than the refractive indices of the lower and upper cladding layers 14 and 16 which surround the active region 19, the generated light is confined in the active region 19. Accordingly, when the gain exceeds the loss at a low current, laser oscillation occurs.

In the prior art SBA laser of such construction, AlGaAs layers constituting the lower and upper cladding layers 14 and 16 and the active layer 15 are successively grown on the layer 12 after the aperture in the current confinement layer 13 is formed. Therefore, depending on the growth conditions, an oxide may remain on the surface of the layer 12 and excess arsenic should attach to the surface of the layer 12. Furthermore, the arsenic or zinc p type impurities in the layer 12 may diffuse out of the layer 12 because GaAs disassociates at a temperature of 650' C. depending on the ambient As pressure. Furthermore, the layer 12 may be irregularly thermally etched. Therefore, a potential barrier may be disadvantageously generated at the re-growth interface 20, increasing the operating voltage of the laser. The re-growth interface 20 may be non-planar itself so that the active region 19 is planar, thereby exciting higher order transverse modes of laser oscillation.

SUMMARY OF THE INVENTION

An object of the present invention is to provide a semiconductor laser device having a low operation voltage and a flat active region, that oscillates in a fundamental transverse mode.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to a semiconductor laser device of the present invention, a substrate is a first conductivity type Si and a current confinement layer is a second conductivity type Si, or a substrate is Si and a current confinement layer is a compound semiconductor. Further, a buffer layer for relieving stress caused by the difference in lattice constants between Si and the chemical compound semiconductor is provided between them. While the aperture section of a current confinement layer is produced by etching, only the current confinement layer can be selectively etched and the surface of the substrate is not affected by the etching, thereby resulting in a high quality surface. Furthermore, there are no residual oxides at the surface of substrate, the Si or p type impurities do not diffuse out of the surface of substrate, and the substrate is not non-uniformly thermally etched during the subsequent crystal growth steps. Furthermore, the stress produced by the difference in lattice constants between Si and the compound semiconductor is relieved by the buffer layer.

DETAILED DESCRIPTION OF THE PREFERRED EMBODIMENTS

An embodiment of the present invention will be described in detail with reference to the drawings.

Figure 1:
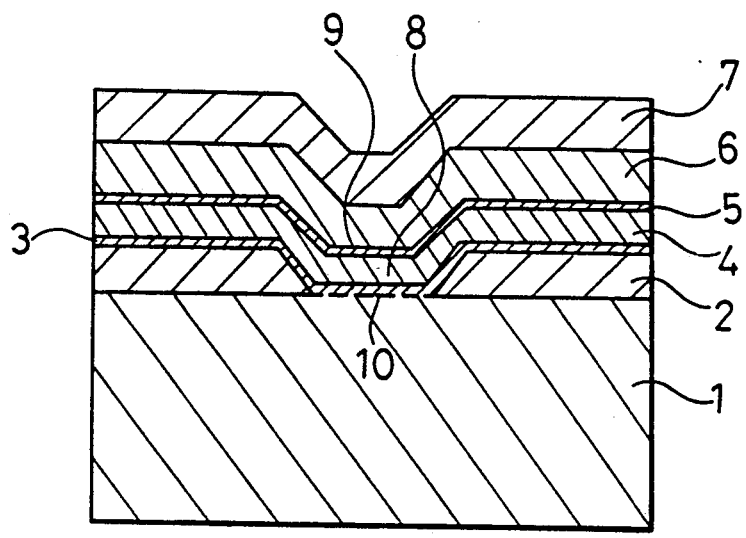
FIG. 1 is a cross section of a semiconductor laser device according to an embodiment of the present invention.
Figure 2:
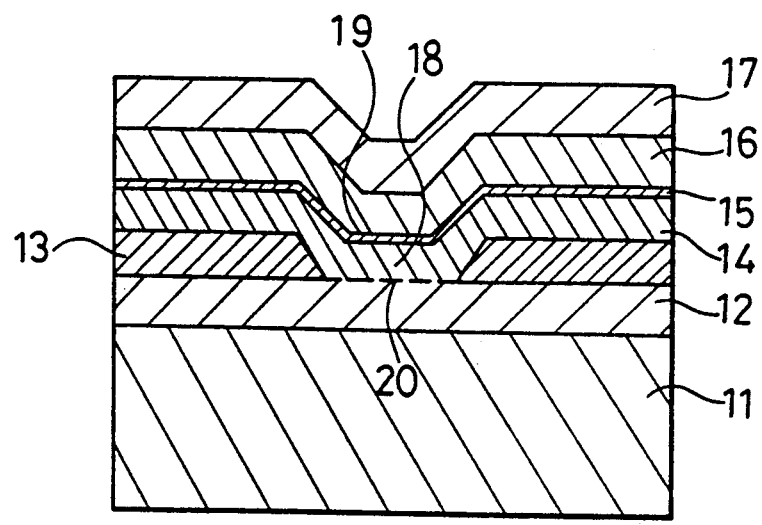
FIG. 2 is a cross section of a prior art SBA laser.

FIG. 1 shows a cross-section of a semiconductor laser device according to an embodiment of the present invention. In FIG. 1, reference numeral 1 designates a p type Si substrate having a (100) orientation. An n type Si current confinement layer 2 of 1.5 micron thickness is disposed on the substrate 1. An aperture section is produced on this current confinement layer 2 by anodic oxidation of the n type current confinement layer 2 and thereafter, removing the oxide film at the aperture region by etching with hydrofluoric acid solution. A buffer layer 3 of 0.4 micron thickness comprising one or several layers of p type AlGaAs is disposed on the current confinement layer 2 for relieving the stress caused by the difference in lattice constants between AlGaAs and Si. A p type $Al_{0.45}Ga_{0.55}As$ lower cladding layer 4 of 1 micron thickness is disposed on the buffer layer 3. An undoped $Al_{0.12}Ga_{0.88}As$ active layer 5 of 0.07 micron thickness is disposed on the lower cladding layer 4. An n type $Al_{0.45}Ga_{0.55}As$ upper cladding layer 6 of 2 micron thickness is disposed on the active layer 5. An n type GaAs contact layer 7 of 3 micron thickness is disposed on the upper cladding layer 6. These laser structure layers are grown on the current confinement layer 2 by the MOCVD method at temperature of about 700° to 800° C. Reference numeral 8 designates a channel region of 1.5 micron width, reference numeral 9 designates an active region, and reference numeral 10 designates a re-growth interface.

The production process of this embodiment laser device will be described.

First of all, an n type current confinement layer 2 is deposited on a p type Si substrate 1. Thereafter, a central portion of the n type Si current confinement layer 2 is anodically oxidized. The oxide film is removed by etching using a hydrofluoric acid solution such as a mixture of hydrofluoric acid, ammonium fluoride ($NH_4F$) and water. Thereafter, a buffer layer 3 for relieving the stress produced by the difference in lattice constants between Si and GaAs la compound semiconductor is deposited on the current confinement layer 2 and the surface of Si substrate 1 at the aperture section, i.e., not covered by the current confinement layer 2. Thereafter, a p type $Al_{0.43}Ga_{0.57}As$ lower cladding layer 4, an undoped $Al_{0.07}Ga_{0.93}As$ active layer 5, an n type $Al_{0.43}Ga_{0.57}As$ upper cladding layer 6 and an n type GaAs contact layer 7 are grown on the buffer layer 3 by the MOCVD method so that the groove configuration is maintained. This MOCVD process is carried out at a temperature of 700° to 800° C. Thus, as a region of the active layer 5, opposite the portion of substrate 1 not covered by current confinement layer 2 is, active region 9. Although not shown in the figure, p side and n side electrodes are disposed on substrate 1 and contacting layer 7 of the laser device, respectively.

In the SBA laser of this embodiment, the substrate 1 is p type Si and the current confinement layer is n type Si. A buffer layer 3 for relieving the stress caused by the difference in lattice constants between Si and GaAs la compound semiconductor, is provided between Si and GaAs. Accordingly, while removing the central portion of the current confinement layer 2 by anodic oxidation and wet etching using a hydrofluoric acid ecthant solution, only the current confinement layer is selectively etched and the p type Si substrate is not etched. Therefore, the surface of p type Si substrate 1 is not affected by the etching, and a good surface which will become a re-growth interface is obtained. Furthermore, in growing AlGaAs compound semiconductor layers as lower and upper cladding layers 4 and 6 and active layer 5, after forming an aperture section in the current confinement layer 2, there are no problems of an oxide remaining on the surface of substrate 1 or that Si and p type impurities such as boron included in the substrate 1 may diffuse out of the substrate 1 because Si is not be melted up to a temperature of about 1100° C. Further, the substrate 1 will not be thermally etched. On the other hand, the stress produced by the difference in lattice constants between Si and GaAs la compound semiconductor, is relieved by the AlGaAs buffer layer 3. Accordingly, the re-growth interface 10 is planar and no potential barrier is produced thereon. Therefore, the active layer 9 is planar and a fundamental transverse mode of oscillation is maintained for a wide range of currents. In addition, the operating voltage is lowered and the extra heat generation is reduced, thereby enabling high temperature operation. Furthermore, since Si has a high thermal conductivity, the heat radiation is improved and a higher temperature operation is enabled.

While in the above-illustrated embodiment the current confinement layer 2 comprises n type Si, the current confinement layer may comprise n type GaAs or n type AlGaAs.

While in the above-illustrated embodiment the substrate 1 is p type and the current confinement layer is n type, the conductivity types of the respective layers may be reversed.

The substrate 1 may include electronic devices which are provided at predetermined regions. The lower and upper cladding layers 4 and 6 and the active layer 5 are not restricted to AlGaAs, and may comprise other compound semiconductors.

While in the above illustrated embodiment an SBA laser is described, the present invention may be also applied to laser devices having other structures.

As is evident from the foregoing description, according to the present invention, a substrate is a first conductivity type Si and a current confinement layer is a second conductivity type Si, or a substrate is Si and a current confinement layer is a compound semiconductor. Further, a buffer layer for relieving the stress caused by the difference in lattice constants between Si and a compound semiconductor is provided between Si and the compound semiconductor. Accordingly, while producing an aperture section a current confinement layer by etching, only the current confinement layer can be selectively etched and the surface of substrate is not affected by influences of etching, thereby resulting in a good re-growth interface. The invention solves the problems of oxides that may remain on the surface of substrate, that Si or impurities included in the substrate should diffuse out of from the substrate, or that the substrate should be non-uniformly thermally etched at the subsequent crystal growth process. Since the re-growth interface is in a good state and the active region is made planar by the buffer layer inserted between the substrate and the compound semiconductor layers, a fundamental transverse mode of oscillation can be obtained in a wide range of laser currents. Furthermore, since no potential barrier is produced at the re-growth interface and the operating current is reduced, higher temperature operation is possible. Because the thermal conductivity of Si is large, heat radiation is improved and further high temperature operation is enabled.

What is claimed is:

1. A semiconductor laser device comprising:

a first conductivity type Si substrate;

a current confinement layer comprising a second conductivity type Si disposed on said substrate and having an aperture extending through said current confinement layer to said substrate;

a plurality of compound semiconductor layers including successively disposed lower cladding, active, and upper cladding layers comprising AlGaAs and GaAs disposed opposite said current confinement layer, opposite said Si substrate, and in said aperture in said current confinement layer forming a semiconductor laser; and an AlGaAs buffer layer disposed between and in contact with said Si substrate and said plurality of compound semiconductor layers for relieving stress caused by the difference in lattice constants between said substrate and said plurality of compound semiconductor layers.

2. A semiconductor laser device as defined in claim 1 wherein said substrate comprises p type Si and said current confinement layer comprises n type Si.

3. A semiconductor laser device as defined in claim 1 wherein said compound semiconductor layers comprise a p type AlGaAs lower cladding layer, an AlGaAs active layer, and an n type AlGaAs upper cladding layer and an n type GaAs contact layer.

4. A semiconductor laser device comprising:

a Si substrate;

a current confinement layer comprising one of GaAs and AlGaAs disposed on said substrate and having an aperture extending through said current confinement layer to said substrate;

a plurality of compound semiconductor layers including successively disposed lower cladding, active, and upper cladding layers comprising AlGaAs and GaAs disposed opposite said current confinement layer, opposite said Si substrate, and in said aperture in said current confinement layer forming a semiconductor laser; and an AlGaAs buffer layer disposed on said Si substrate at the aperture and on said current confinement layer beyond the aperture between said plurality of compound semiconductor layers and said Si substrate and said current confinement layer for relieving stress caused by the difference in lattice constants between said substrate and said plurality of compound semiconductor layers.

5. A semiconductor laser device as defined in claim 4 wherein said compound semiconductor layers comprise a p type AlGaAs lower cladding layer, an AlGaAs active layer, an n type AlGaAs upper cladding layer, and an n type GaAs contact layer.

* * * * *